United States Patent
Inoue et al.

(10) Patent No.: US 7,525,142 B2
(45) Date of Patent: Apr. 28, 2009

(54) SEMICONDUCTOR DEVICE INCLUDING A CONDUCTIVE LAYER BURIED IN AN OPENING AND METHOD OF MANUFACTURING THE SAME

(75) Inventors: Hirofumi Inoue, Kamakura (JP); Masahito Shinohe, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 181 days.

(21) Appl. No.: 11/638,492

(22) Filed: Dec. 14, 2006

(65) Prior Publication Data
US 2007/0085125 A1    Apr. 19, 2007

Related U.S. Application Data

(63) Continuation of application No. PCT/JP2005/014138, filed on Jul. 27, 2005.

(30) Foreign Application Priority Data
Jul. 28, 2004    (JP)    ............... 2004-220664

(51) Int. Cl.
*H01L 27/108*    (2006.01)
(52) U.S. Cl. ............... 257/301; 257/300; 257/E29.346; 257/E21.396; 438/243
(58) Field of Classification Search ................. 257/300, 257/301, 304, E29.346, E21.396; 438/241, 438/243, 386
See application file for complete search history.

(56) References Cited

U.S. PATENT DOCUMENTS

| | | | |
|---|---|---|---|
| 5,300,800 A | 4/1994 | Bronner et al. | |
| 5,451,809 A | 9/1995 | Shiozawa et al. | |
| 6,359,300 B1 | 3/2002 | Economikos et al. | |
| 6,638,815 B1 | 10/2003 | Bronner et al. | |
| 6,750,111 B2 | 6/2004 | Schrems | |
| 6,960,503 B2 * | 11/2005 | Hsu et al. | ............... 438/243 |
| 2002/0135007 A1 | 9/2002 | Koike et al. | |
| 2004/0082137 A1 | 4/2004 | Huang et al. | |
| 2004/0106254 A1 | 6/2004 | Furuhata et al. | |

FOREIGN PATENT DOCUMENTS

JP    2004-179451    6/2004

OTHER PUBLICATIONS

International Search Report issued in PCT/JP2005/014138 dated Apr. 25, 2006.
Written Opinion of the International Searching Authority issued in PCT/JP2005/014138.

* cited by examiner

*Primary Examiner*—Quoc D Hoang
(74) *Attorney, Agent, or Firm*—Finnegan, Henderson, Farabow, Garrett & Dunner, L.L.P.

(57) ABSTRACT

A trench capacitor is formed in a semiconductor substrate with a capacitor insulating film. The trench has a conductive layer as storage node electrode buried in a trench. The conductive layer includes a first, a second, and third conductive layer. The first conductive layer is buried in a lower portion of the trench. The second conductive layer is buried in a recess on the upper surface of the first conductive layer. The third conductive layer is buried to contact with the first and second conductive layers.

10 Claims, 8 Drawing Sheets

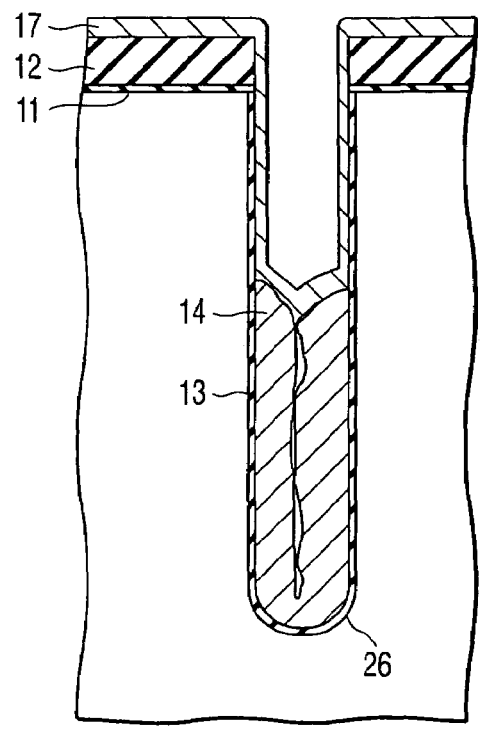
F I G. 2 C
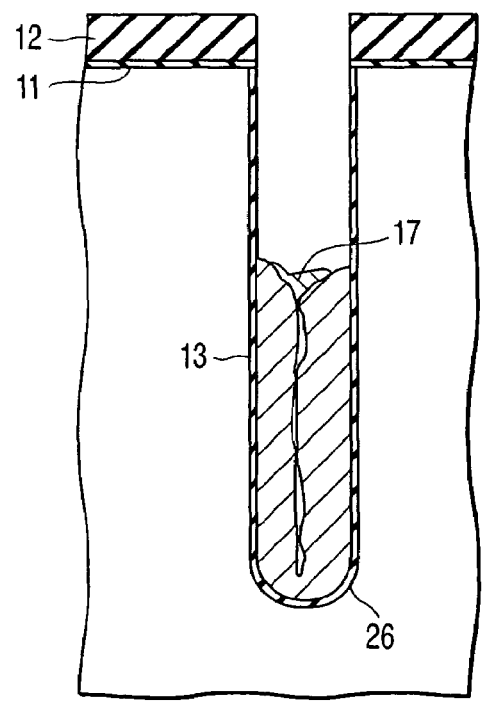
F I G. 2 D

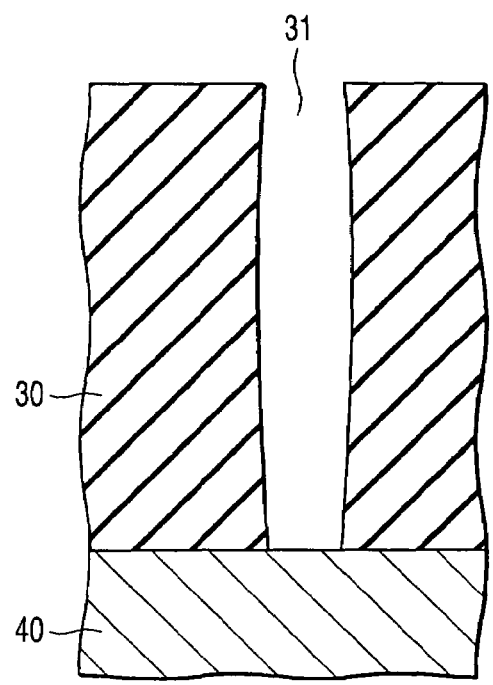
F I G. 4 A
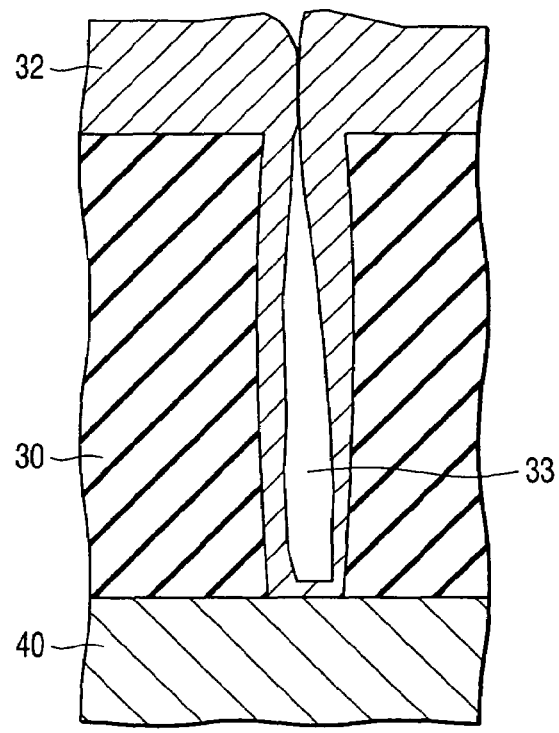
F I G. 4 B

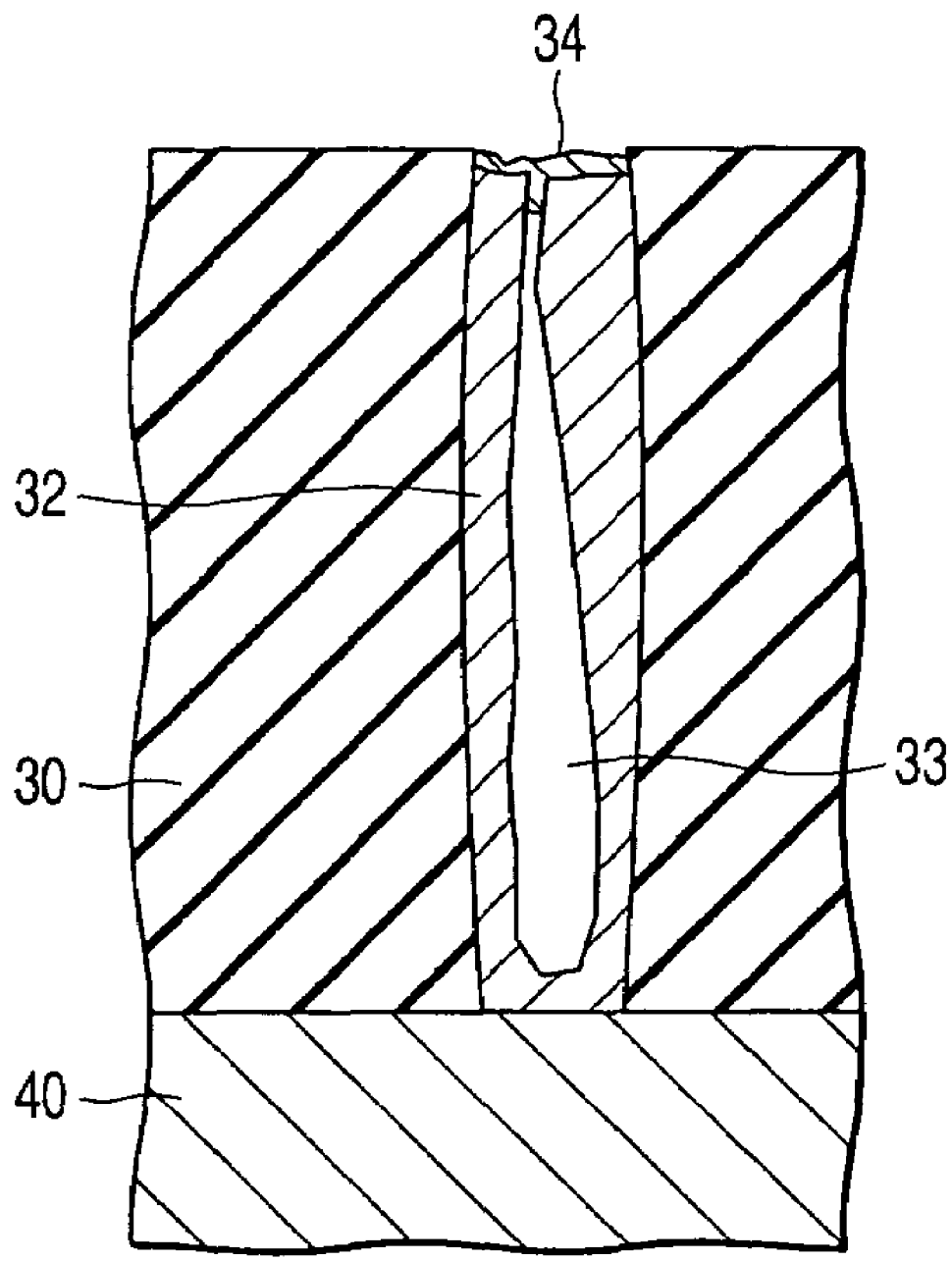
F I G. 4 E

SEMICONDUCTOR DEVICE INCLUDING A CONDUCTIVE LAYER BURIED IN AN OPENING AND METHOD OF MANUFACTURING THE SAME

CROSS REFERENCE TO RELATED APPLICATIONS

This is a Continuation Application of PCT Application No. PCT/JP2005/014138, filed Jul. 27, 2005, which was published under PCT Article 21(2) in English.

This application is based upon and claims the benefit of priority from prior Japanese Patent Application No. 2004-220664, filed Jul. 28, 2004, the entire contents of which are incorporated herein by reference.

BACKGROUND OF THE INVENTION

1. Field of the Invention

The present invention relates to a semiconductor device including a conductive layer buried in an opening formed in a semiconductor substrate or an insulator thereon, and a method of manufacturing the same.

2. Description of the Related Art

Device scale-down and high integration have advanced in a semiconductor integrated circuit. As a result, devices must be formed in a region having a small area with high density. For example, a semiconductor memory device such as CMOS dynamic random access memory (DRAM) having a large capacitance needs to increase the storage capacitance of memory devices effectively using the narrow region. In order to increase the storage capacitance, a trench capacitor using the side wall of a trench as a cell capacitor is employed. The trench capacitor has the following two structures. For example, according to one structure, a diffusion layer is formed in a substrate contacting with the trench, the diffusion layer is used as one of the capacitor electrode, and a storage electrode is buried in the trench via a capacitor insulating film. According to another structure, a substrate formed with a trench is used as one of the capacitor electrodes, that is, plate electrode, and a storage electrode is buried in the trench via a capacitor insulating film.

The trench capacitor is conventionally formed in the following manner. The following is an explanation about the process of manufacturing the trench capacitor having the latter structure. A trench is formed in a semiconductor substrate. The inner surface of the trench is formed with a capacitor insulating film. A first conductive material is further buried (filled) in the trench. Thereafter, recess etching is carried out so that the first conductive material remains in only lower portion of the trench. Then, a collar oxide film is deposited in the inner surface of the trench, and thereafter, the bottom portion of the collar oxide film is removed. A second conductive material is further buried in the trench. The first conductive material is used as the storage electrode and the second conductive material is used as the contact plug between the storage electrode and a third conductive material is buried above the second material.

When the cross section of the trench has a tapered shape, there is no problem. However, the aspect ratio of the trench becomes high resulting from device miniaturization, and thereby, it is difficult to control the sectional shape of the trench. For this reason, the side of the trench has the following sectional shapes. More specifically, the angle to the extended surface of the bottom surface of the trench is an approximately right angle, for example, 89° or more, that is, the side of the trench has a non-tapered shape. Further, the foregoing angle is 100° or more, that is, the side of the trench has an obtuse angle reverse tapered shape or acute angle overhang shape. In such a case, an empty space (cavity) is generated in the first conductive material, or a recess is generated on the upper surface of the first conductive material.

When the collar oxide film is deposited in the trench in the foregoing state, the bottom of the collar oxide film is buried in the cavity generated in the first conductive material or the recess on the upper surface thereof. Thereafter, when the bottom of the collar oxide film is etched, there is a possibility that an etching residual of the collar oxide film occurs. This is a factor of causing the following problem. When the second conductive material is deposited on the first conductive material in the post process, the connection state between the first and second conductive materials becomes non-uniform or insufficient. As a result, the resistance value of the storage electrode increases, and further, the connection state between the first and second conductive materials becomes a breaking state. Thus, open fail of the storage electrode occurs.

The same problem as the trench capacitor arises in the following case. More specifically, conductive materials such as metal and polycrystalline silicon are buried in an opening having high aspect ratio, formed an insulating layer on the semiconductor substrate, for example, contact or via opening, and plug is formed. In other words, when the cross section of the opening having high aspect ratio has a tapered shape, no problem arises. It is difficult to control the cross section of the opening to form a desired shape resulting from the influence of micro loading effect. When the cross section of the opening is formed into a vertical shape or a reverse tapered shape or overhang shape, coverage characteristic is worsened when the conductive material is buried (filled) in the opening. As a result, a cavity is generated in the conductive material, or a recess is formed on the upper surface of the conductive material. Thereafter, upper-layer interconnects are formed to contact with the surface of the conductive material. In this case, the problem arises in contact uniformity between the upper-layer interconnects and the conductive material and in flatness of interconnection layers.

U.S. Pat. No. 5,300,800 discloses a substrate plate type DRAM cell structure using a trench capacitor. U.S. Pat. No. 5,451,809 discloses a technique of etching back polysilicon buried in the trench, and forming a cap layer using amorphous silicon. U.S. Pat. No. 6,638,815 discloses a technique of burying (filling) amorphous silicon in the upper portion of a polysilicon electrode in the trench to form a trench capacitor. U.S. Pat. No. 6,359,300 discloses the following process technique. According to the process technique, silicon germanium is buried in the trench, and annealed, and thereby, a trench buried layer reducing thermal stress is formed. A collar oxide film is further formed, and thereafter, a conductive layer is buried.

BRIEF SUMMARY OF THE INVENTION

According to a first aspect of the present invention, there is provided a semiconductor device comprising:

a semiconductor substrate; and a trench capacitor having a storage electrode buried in a trench formed in the semiconductor substrate via a capacitor insulating film;

the storage electrode including:

a first conductive layer buried in a lower portion of the trench, and having a recess at its surface;

a second conductive layer buried in the recess of the first conductive layer; and a third conductive layer buried in the upper portion of the first and second conductive layers to contact with both first and second conductive layers.

According to a second aspect of the present invention, there is provided a method of manufacturing a semiconductor device, comprising:

forming a trench in a semiconductor substrate;
forming a capacitor insulating film on an inner surface of the trench;
burying a first conductive layer in the trench;
etching the first conductive layer to leave the first conductive layer which is left by the half-portion of the trench;
forming a second conductive layer on the inner surface of the trench;
etching the second conductive layer, and leaving the second conductive layer to bury a recess generated on the first conductive layer in the trench;
removing the capacitor insulating film exposed in the trench;
forming a collar insulating film on the inner surface of the trench after the capacitor insulating film is removed; and
burying a third conductive layer in the trench.

BRIEF DESCRIPTION OF THE SEVERAL VIEWS OF THE DRAWING

FIGS. 2A to 2G are cross-section view showing the process of manufacturing the DRAM device shown in FIG. 1;

FIGS. 4A to 4E are cross-section view showing the process of manufacturing the DRAM device shown in FIG. 3.

DETAILED DESCRIPTION OF THE INVENTION

Figure 1:
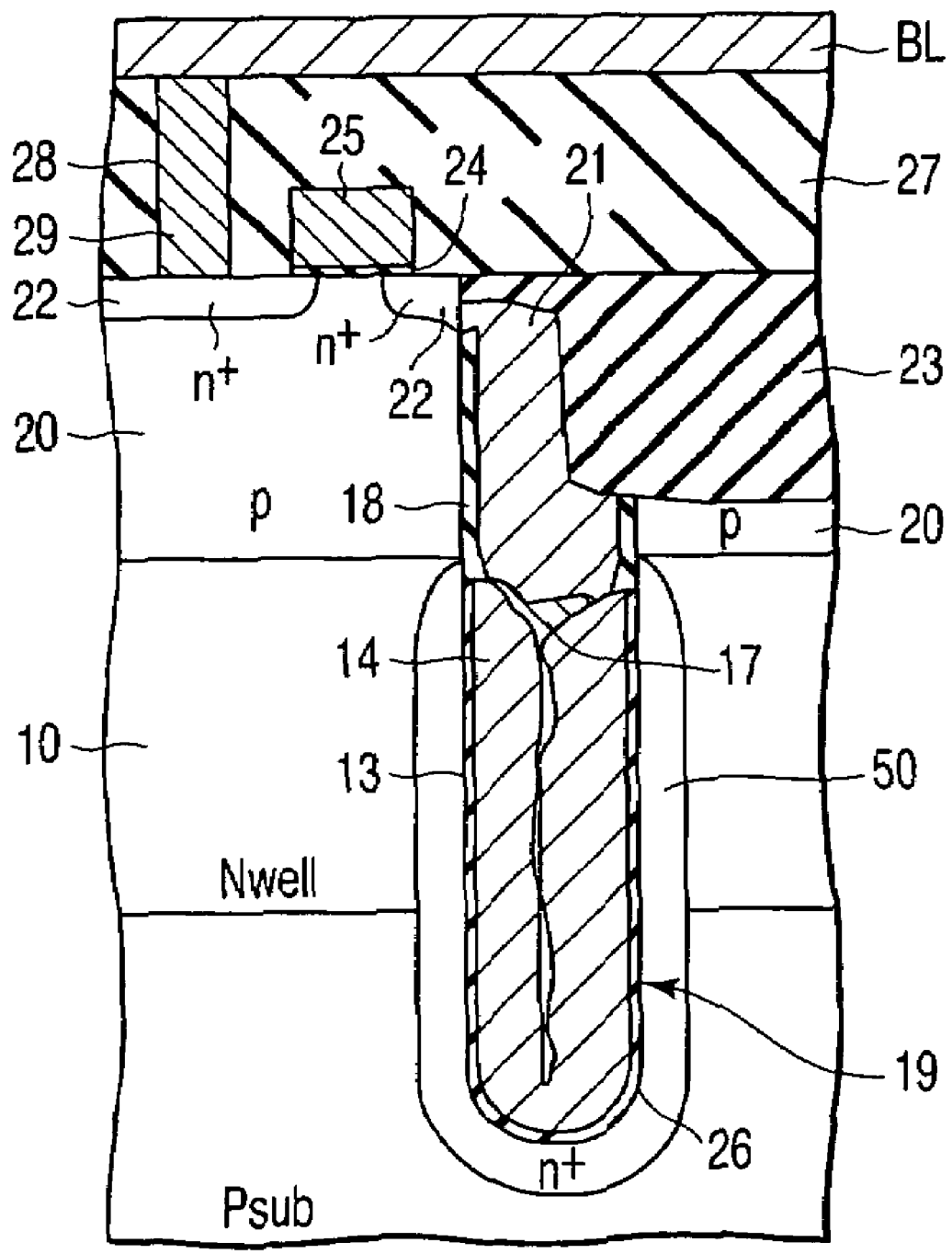
FIG. 1 is a cross-section view showing the structure of a DRAM device according to a first embodiment of the present invention.

Embodiments of the present invention will be described below with reference to the accompanying drawings. In the following description, the same reference numerals are used to designate portions common to all drawings.

FIRST EMBODIMENT

FIG. 1 shows a cross section of one memory cell of a DRAM device according to a first embodiment of the present invention. The memory cell has a substrate plate type trench capacitor.

For example, the surface layer of a semiconductor substrate having a p-type silicon substrate is formed with a p-well 20. The semiconductor substrate is formed with an n-well 10, which is doped with high concentration n-type impurity, at a deep position separated from the surface of the substrate. The surface layer of the p-well 20 is formed in a shallow trench with a shallow trench type isolation region (STI) 23, which is filled with an insulating film such as silicon nitride film or silicon oxide film.

The semiconductor substrate is formed with a substrate plate type trench capacitor 19. The trench capacitor 19 is formed with a deep trench 26, which extends from the substrate surface into at least the n-well 10. The inner surface of the trench 26 is formed with a capacitor insulating film (insulator) 13. A collar insulating film 18 such as silicon oxide film or silicon nitride film is formed above the inner surface of the trench 26 by the position deeper than the p-well 20. A conductive layer is buried in the trench as a storage electrode. A plate electrode 50 of the trench capacitor 19 is formed in the circumference of the trench 26. According to the first embodiment, the conductive layer includes first to third conductive layers 14, 17 and 21. The first conductive layer 14 has a recess at the upper portion. The second conductive layer 17 is made of amorphous silicon, which is buried in the recess of the first conductive layer 14 to planarize the upper surface thereof. The third conductive layer 21 is buried on the upper portion of the first and second conductive layers 14 and 17 to contact with these layers. Each of the first and third conductive layers 14 and 21 is made of doped polysilicon, or metal silicide or metal layer. The amorphous silicon forming the second conductive layer 17 is doped with impurity to achieve low resistance.

The surface layer of the p-well 20 around the trench capacitor 19 is formed with an active region of a transfer n-MOSFET (n-channel insulated gate field effect transistor). The n-MOSFET includes source/drain region 22, channel dope layer, gate insulating film 24 and gate electrode 25. More specifically, the source/drain region 22 is made of an n-type impurity diffusion layer formed on the surface layer of the p-well 20. The gate insulating film 24 is formed on the surface of the p-well 20. The gate electrode 25 is formed on the gate insulating film 24, and functions as part of a word line of the cell array or part of a passing word line on the isolation region 23.

The surface of the gate electrode 25 is covered with a passivation film, and further formed with insulating film and interlayer insulating film 27. The interlayer insulating film 27 is formed with an opening 28 communicating with the drain region 22 of a transfer n-MOSFET of the DRAM cell. A bit line contact 29 connected electrically to the drain region 22 of the N-MOSFET is buried and formed in the opening 28. A bit line BL including metal interconnect connected electrically to the bit line contact 29 is formed above the interlayer insulating film 27.

Part of the upper edge portion of the collar insulating film 18 is removed in the vicinity of the opening of the trench 26. Polysilicon containing arsenic or phosphorus as n-type impurity is formed in the removed portion as a conductive layer for connecting the third conductive layer 21 and the drain region 22 of the N-MOSFET via the removed portion.

Figure 2A:
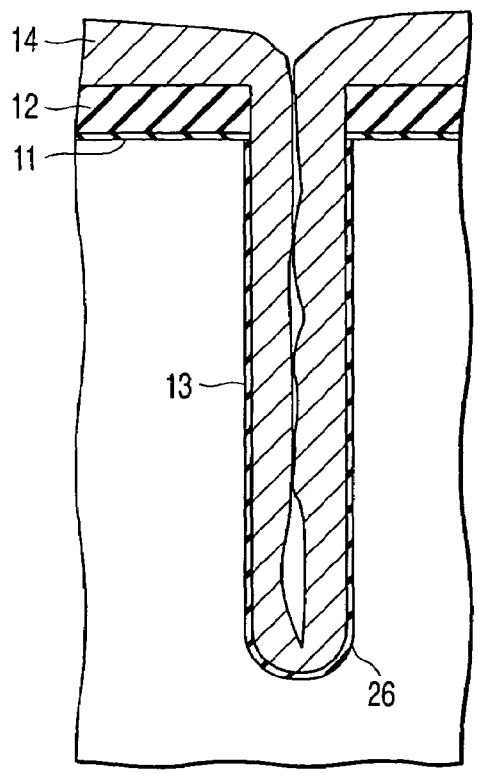

The process of manufacturing the DRAM device shown in FIG. 1 will be described below. As shown in FIG. 2A, the pattern of silicon oxide and nitride films 11 and 12 is formed on a p-type silicon substrate. Then, a deep trench is formed from the surface of the substrate according the anisotropic etching technique using the pattern as an etching mask. In this case, when the trench 26 is formed to have an aspect ratio of 3 or more, there is a possibility that the cross section of the trench 26 has the following shape. More specifically, an angle to the extended surface of the bottom surface of the trench is vertical, for example, 89° or more, that is, the side of the trench 26 has a non-tapered shape.

The inner surface of the trench 26 is formed with a capacitor insulating film 13 containing high dielectrics such as $SiO_2$, $Si_3N_4$, $Al_2O_3$, $Ta_2O_5$ or $HfO_2$. The first conductive layer 14 such as doped polysilicon, metal silicide layer or metal layer is deposited on the entire surface so that the first conductive layer 14 is buried in the trench 26.

Figure 2B:
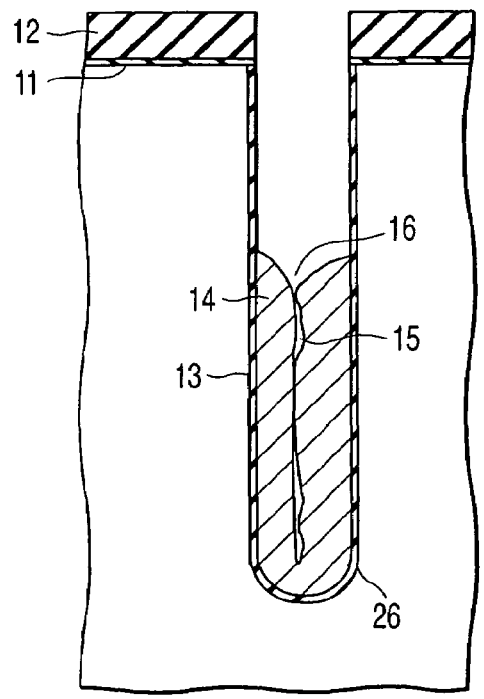

Thereafter, as illustrated in FIG. 2B, the first conductive layer 14 on the upper surface and above the trench 26 is removed using recess etching technique such as wet etching or isotropic dry etching. By doing so, the first conductive layer 14 is left so that it is positioned lower than the p-well 20 formed later. In this case, when the cross section of the trench 26 has the vertical shape as described above, a cavity 15 is generated in the first conductive layer 14. In addition, a recess 16 is formed on the upper surface of the first conductive layer 14.

According to the first embodiment, as depicted in FIG. 2C, thin amorphous silicon 17 implanted with impurity is formed as a second conductive layer using a spattering process. In this case, the amorphous silicon 17 is formed at low temperature in order to obtain good coverage characteristic. As seen from FIG. 2D, the amorphous silicon 17 is etched back using the dry etching technique such as chemical dry etching (CDE) or isotropic etching such as wet etching using KOH. By doing so, one of the cavity 15 of the first conductive layer 14 and the recess 16 formed thereon, that is, at least recess 16 is buried in the amorphous silicon 17. Thus, the surface of the first conductive layer 14 is substantially planarized.

In the foregoing etch-back of the amorphous silicon 17, the following condition is given. Etching time is controlled so that the etching amount of the amorphous silicon is within an over etching range of 50%, preferably 20% to an amount equal with respect to the deposited amorphous silicon, that is, just etching. The condition is satisfied, and thereby, it was found that the flatness of the upper surface of the first conductive layer 14 is secured as desired.

Figure 2E:
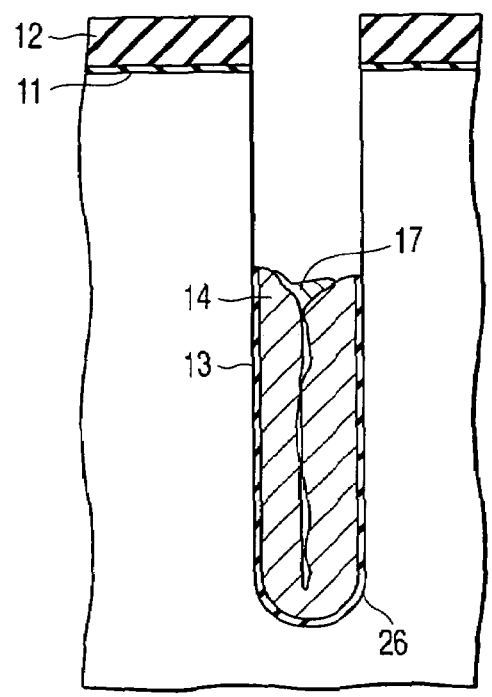
Figure 2F:
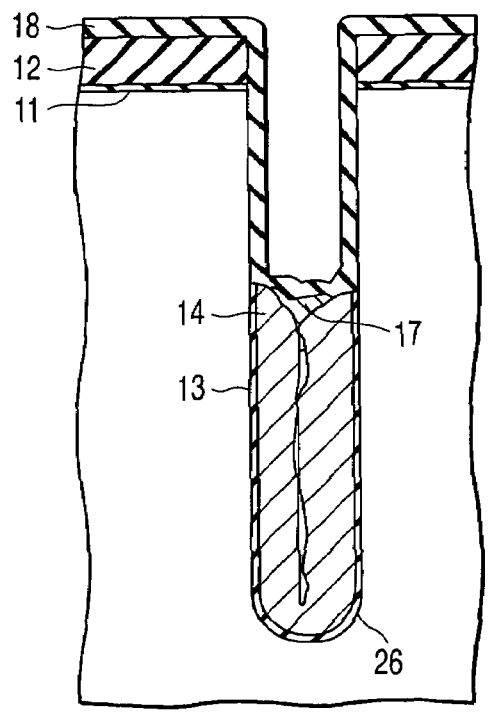

As shown in FIG. 2E, the capacitor insulating film 13 exposed in the inner surface of the trench 26 is removed. As seen from FIG. 2F, a collar insulating film 18 made of oxide film or nitride film is formed in the inner surface of the trench 26. This is because of sufficiently secure isolation between the third conductive layer 21 buried later in the trench 26 and the p-well 20 formed later in the surface layer of the substrate.

Figure 2G:
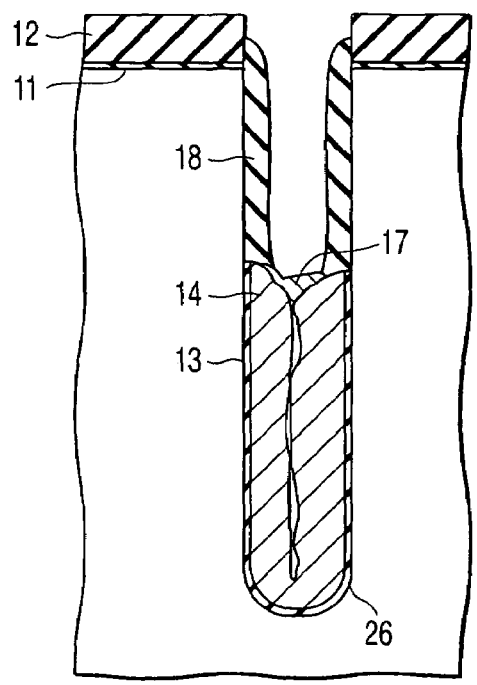

Thereafter, as illustrated in FIG. 2G, the bottom portion of the collar insulating film 18 is removed. By doing so, conduction is secured between the third conductive layer 21 buried in the trench 26 in the post process and already buried amorphous silicon 17 and first conductive layer 14. As depicted before in FIG. 1, the collar insulating film 18 contacting with the source region 22 of the transfer gate n-MOSFET is removed. By doing so, conduction is secured between the third conductive layer 21 buried in the trench 26 in the post process and the source region 22.

The trench is filled with the third conductive layer made of doped polysilicon, metal silicide or metal layer. In this case, the amorphous silicon 17 is already buried in the recess on the upper surface of the first conductive layer 14. Therefore, the upper surface of the first conductive layer 14 is almost planarized. Thus, a connection between the third and first conductive layers 21 and 14 is sufficiently made; therefore, there is no generation of defect, which hinders the connection state between both layers. The first conductive layer 14 is used as the storage electrode and the third conductive layer 21 is used as the contact plug between the storage electrode and the source region 22. The resistance value of the storage electrode is low, and the variation of the resistance value is reduced.

Thereafter, the isolation region 23 is formed using a normal process, and the silicon oxide film 11 and the silicon nitride film 12 is removed. The gate insulating film 24 of the transfer gate n-MOSFET, gate electrode (word line) 25, source/drain region 22, interlayer insulating film 27, bit line contact 29 and bit line BL are formed. In the manner described above, the substrate plate type DRAM cell is manufactured.

Incidentally, when non-doped layer is used as the amorphous silicon, the electric connection is made between first and third conductive layers 14 and 21 without hindrance. This results from the following reason. In the process after the third conductive layer 21 is buried, impurity contained in the first and third conductive layers 14 and 21 is self-aligned and diffused by heat treatment at the temperature of about 800° or more. Thus, the amorphous silicon 17 has low resistance.

The amorphous silicon 17 is formed using the sputtering process. In this case, either of metal or barrier metal formed by CVD (Chemical Vapor Deposition) may be used. This is because the second conductive layer is deposited in a state of having good coverage characteristic with respect to the first conductive layer 14 such as barrier metal.

In the DRAM device of the first embodiment, a preferable storage electrode is formed without hindrance when the cross section of the trench 26 formed with the trench capacitor 19 has a vertical shape. In other words, when the coverage characteristic of the first conductive layer is worse and a cavity is generated in the first conductive layer, the generation of the etching residual of the collar oxide film is prevented.

The first embodiment has explained about the case where the cross section of the trench has a vertical shape. For example, the cross section of the trench has a reverse tapered shape having an angle of 100° or more or an overhang shape. In also case, the present invention is carried out in the same manner as above, and the same effect as above is obtained.

In the foregoing process, the trench capacitor is formed having the following structure. According to the structure, the conductive layer is buried in the trench having 3 or more aspect ratio formed in the semiconductor substrate via the capacitor insulating film. In this case, the process of burying the conductive layer is divided into several times, and a specific burying process give below may be introduced on the way of the above-mentioned process. According to the burying process, the cavity generated in the conductive layer and the recess formed on the upper surface thereof, that is, at least recess on the upper surface, is buried. By doing so, a preferable storage electrode is formed without hindrance even when cross section of the trench has a vertical shape.

The first embodiment has explained about the DRAM device having a transfer gate n-MOSFET formed on the surface layer of the p-well 20. The present invention is applicable to a vertical transistor type DRAM device having a transfer gate n-MOSFET formed vertically above the extended line of the side of the trench.

A memory cell of the vertical transistor type DRAM device differs from the memory cell shown in FIG. 1 in the following point, and other configuration is the same. More specifically, the source/drain region of the n-MOSFET is vertically formed on the p-well above the extended line of the side of the trench. The gate insulating film is vertically formed on the surface of the p-well.

SECOND EMBODIMENT

Figure 3:
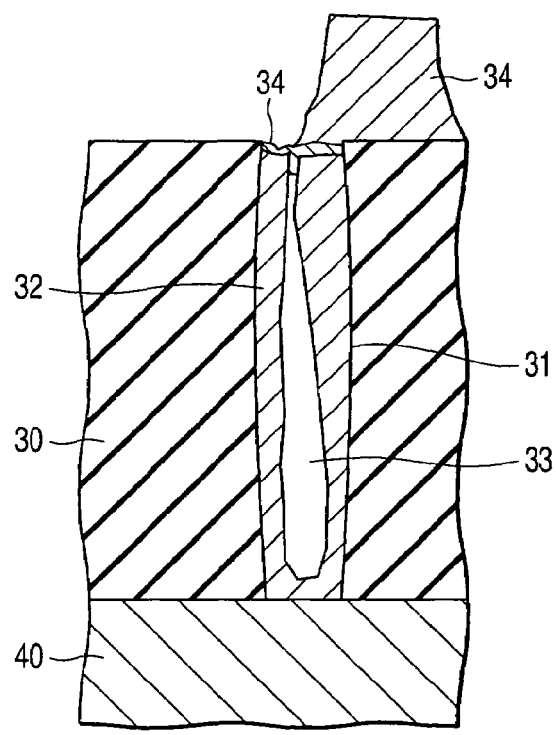
FIG. 3 is a cross-section view showing the structure of a DRAM device according to a second embodiment of the present invention.

FIG. 3 shows part of the cross section of a DRAM device according to a second embodiment of the present invention. The DRAM device is formed with a via plug for mutually connecting interconnects arranged vertically in an insulating layer. The via plug has a structure in which a conductive layer is buried in a micro opening having aspect ratio formed in the insulating layer on an interconnection layer on a semiconductor substrate.

In FIG. 3, an insulating layer 30 is formed on a bottom interconnection layer 40 on a semiconductor substrate. The insulating layer 30 is formed with a via opening 31, and a conductive layer is buried in the via opening, and thereby, a via plug is formed. The via plug includes a first conductive layer 32 buried in the opening 31, and a second conductive layer 34. In this case, the second conductive layer 34 is buried in a cavity 33 generated in the first conductive layer 31 and a recess formed thereon, that is, at least recess. The via plug is connected with a top interconnection layer 34.

The process of manufacturing the DRAM device shown in FIG. 3 will be described below. As shown in FIG. 4A, the insulating layer 30 on the bottom interconnection layer 40 on the semiconductor substrate is formed with the opening 31. When the opening 31 has an aspect ratio of 3 or more, opening diameter of 100 nm and depth of 500 nm, there is a possibility that the opening 31 has the following cross sectional shapes. More specifically, the side of the opening has a vertical shape having an angle of 89° or more to the extended surface of the bottom surface of the opening, for example. Further, the side of the opening has a reverse tapered shape having an angle of 100° or more or an overhang shape.

As illustrated in FIG. 4B, the first conductive layer 32 is buried in the opening 31. Doped polysilicon or metal such as Ti or inter-metallic compound made of any one of silicide layer such as TiSi, NiSi and CoSi and TiN is used as the first conductive layer 32.

When the section of the opening 31 has a vertical shape, reverse tapered shape or overhang shape, there is a possibility that the cavity 33 is generated in the first conductive layer 32 and a recess is generated on the upper surface of the first conductive layer 32. In a state that the cavity 33 and recess are intactly left, when the top interconnection layer is formed to contact with at least part of the upper portion of the opening, the following problems arise. Electric connection with the top interconnection layer becomes insufficient in the vicinity of the recess on the upper surface of the via plug. Further, in anisotropic etching in the interconnection forming process, the conductive layer 32 on the bottom of the opening and the bottom interconnection layer 40 under there are etched off through the cavity 33 of the via plug.

Figure 4C:
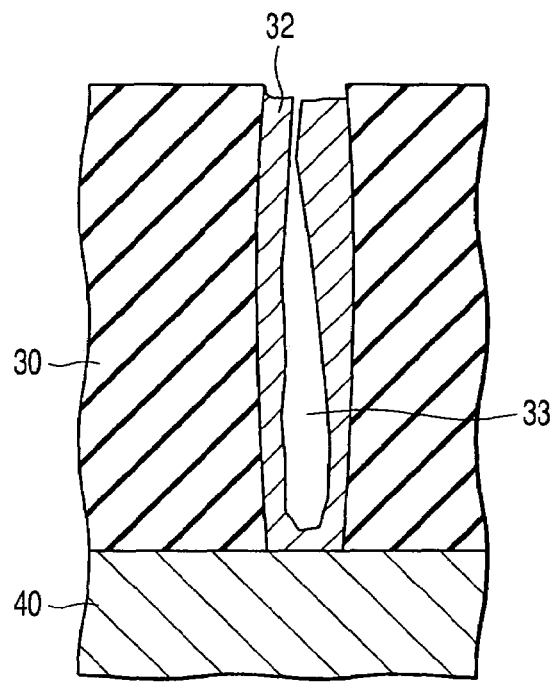
Figure 4D:
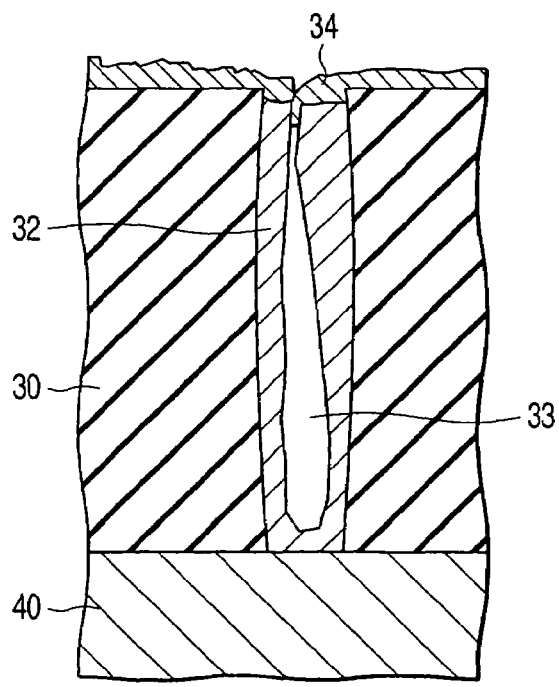

In order to solve the foregoing problems, according to the second embodiment, the process given below is carried out. More specifically, the first conductive layer 32 is buried in the opening. Thereafter, as depicted in FIG. 4C, the first conductive layer 32 is removed by the position of the opening surface or lower than that using isotropic etching or anisotropic etching or chemical mechanical polishing (CMP). As seen from FIG. 4D, thin amorphous silicon 34 formed at low temperature is deposited using sputtering having good coverage characteristic. As shown in FIG. 4E, the amorphous silicon 34 is etched back using isotropic etching so that the recess on the upper surface of the first conductive layer 32 is fully filled with the amorphous silicon 34. By doing so, the upper surface is substantially planarized. Preferably, the cavity 33 of the upper portion of the first conductive layer 32 is at least filled with the amorphous silicon 34. Therefore, it is possible to obtain a via plug whose upper surface has good flatness.

Then, amorphous silicon used as top interconnection layer is further deposited on the entire surface including the insulating layer 30, and patterning is carried out. By doing so, the top interconnection layer 34 preferably contacting with the via plug is formed as shown in FIG. 3.

In the DRAM device of the second embodiment, a preferable via plug is formed without hindrance when the cross section of the opening 31 has a vertical shape or reverse tapered shape or overhang shape. As a result, this serves to solve the following problems. The ratio of the cavity to the total area of the via plug becomes high resulting from the reduction of design rule, and finally, the resistance of the via plug becomes too high, or is lack in uniformity, or process defect occurs.

In the foregoing process, a specific burying process give below is introduced when forming a buried plug having a structure in which the conductive layer is buried in the recess of the opening 31 having aspect ratio of 3 or more formed in the insulating layer 30 on the semiconductor substrate. According to the burying process, the cavity generated in the conductive layer and the recess formed on the upper surface thereof, that is, at least recess on the upper surface, is buried. By doing so, a preferable via plug is formed without hindrance when the cross section of the opening has a vertical shape or reverse tapered shape or overhang shape.

The amorphous silicon formed by sputtering is used as the top interconnection layer 34. In this case, either of metal or barrier metal formed by chemical vapor deposition (CVD) may be used as the top interconnection layer 34. This is because the second conductive layer is deposited in a state of having good coverage characteristic with respect to the first conductive layer 32 such as metal and barrier metal.

The second embodiment has explained about the case of forming the via plug of the DRAM device. In this case, the second embodiment is applicable to a trench capacitor given below. The trench capacitor is formed in a manner of forming a diffusion layer at the substrate side contacting with the trench as one of the capacitor electrode, and burying a storage electrode in the recess of the trench via the capacitor insulating film.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate; and
   a trench capacitor having a storage electrode buried in a trench formed in the semiconductor substrate via a capacitor insulating film;
   the storage electrode including:
   a first conductive layer buried in a lower portion of the trench, and having a recess at its surface;
   a second conductive layer buried in the recess of the first conductive layer; and
   a third conductive layer buried in the upper portion of the first and second conductive layers to directly contact with both first and second conductive layers.

2. The device according to claim 1, wherein each of the first and third conductive layers includes any one of polysilicon, metal and inter-metallic compound, and the second conductive layer includes amorphous silicon deposited at low temperature.

3. The device according to claim 1, wherein each of the first and third conductive layers includes any one of polysilicon, metal and inter-metallic compound, and the second conductive layer includes any of metal and barrier metal each deposited by chemical vapor deposition.

4. The device according to claim 1, wherein the trench capacitor further includes a plate electrode formed in the semiconductor substrate around the trench.

5. The device according to claim 1, wherein the trench has an aspect ratio of 3 or more.

6. A semiconductor device comprising:
   a semiconductor substrate;
   a semiconductor layer of a first conduction type formed on the semiconductor substrate;
   a gate electrode of a MOSFET for charge transfer gate formed on the semiconductor layer via a gate insulating film;

a source and a drain regions of a second conduction type formed on a surface layer of the semiconductor layer; and a trench capacitor connected electrically to one of the source and drain regions, the trench capacitor including:

a capacitor insulating film formed below the semiconductor layer in an inner surface of a trench formed in the semiconductor substrate;

a collar insulating film above the capacitor insulating film in the inner surface of the trench; and a storage node electrode buried in the trench, and connected electrically to one of the source and drain regions, the storage node electrode including:

a first conductive layer formed on the capacitor insulating film in the trench to bury a lower portion of the trench, and having a recess at the upper surface;

a second conductive layer buried in the recess of the first conductive layer; and a third conductive layer buried in the trench, and directly contacting with the upper portion of the first and second conductive layers.

7. The device according to claim 6, wherein each of the first and third conductive layers includes any one of polysilicon, metal and inter-metallic compound, and the second conductive layer includes amorphous silicon deposited at low temperature.

8. The device according to claim 6, wherein each of the first and third conductive layers includes any one of polysilicon, metal and inter-metallic compound, and the second conductive layer includes any of metal and barrier metal each deposited by chemical vapor deposition.

9. The device according to claim 6, wherein the trench capacitor further includes a plate electrode formed in the semiconductor substrate around the trench.

10. The device according to claim 6, wherein the trench has an aspect ratio of 3 or more.

* * * * *